(12) United States Patent
Kitamura

(10) Patent No.: US 7,607,113 B2
(45) Date of Patent: Oct. 20, 2009

(54) WIRING PATTERN DETERMINATION METHOD AND COMPUTER PROGRAM PRODUCT THEREOF

(75) Inventor: Tamotsu Kitamura, Nagano (JP)

(73) Assignee: Shinko Electric Industries Co., Ltd. (JP)

(*) Notice: Subject to any disclaimer, the term of this patent is extended or adjusted under 35 U.S.C. 154(b) by 464 days.

(21) Appl. No.: 11/527,250

(22) Filed: Sep. 25, 2006

(65) Prior Publication Data
US 2007/0072316 A1  Mar. 29, 2007

(30) Foreign Application Priority Data
Sep. 28, 2005  (JP) ............... 2005-282246

(51) Int. Cl.
G06F 17/50 (2006.01)
(52) U.S. Cl. .............. 716/2; 716/9; 716/10; 716/11; 716/12
(58) Field of Classification Search .......... 716/2, 716/9–14
See application file for complete search history.

(56) References Cited

U.S. PATENT DOCUMENTS 6,596,549 B2  7/2003  Kitamura et al.

2005/0050505 A1*  3/2005  Bednar et al. ............ 716/12

FOREIGN PATENT DOCUMENTS

| JP | 2002-083006 | 3/2002 |
|----|-------------|--------|
| JP | 2002-149734 | 5/2002 |

\* cited by examiner

Primary Examiner—Paul Dinh
(74) Attorney, Agent, or Firm—Walter G. Hanchuk; Chadbourne & Parke LLP

(57) ABSTRACT

A wiring pattern determination method and a computer program thereof comprise a step of moving positions of tentatively designed plated leads on an edge of a semiconductor package to the positions that can be accommodated in positionable windows nearest to the respective tentatively designed plated lead positions, in a template in which the positionable windows are arranged, so that the positionable windows have a predetermined pitch in a row direction corresponding to an identical layer of a multi-layered structure and so that the positionable windows are positioned at least in every other row in a column direction corresponding to a lamination direction of the multi-layered structure and, then, determining the moved positions as optimal positions of the plated leads.

4 Claims, 12 Drawing Sheets

WIRING PATTERN DETERMINATION METHOD AND COMPUTER PROGRAM PRODUCT THEREOF

PRIORITY CLAIM

This application claims priority under 35 U.S.C. § 119 for Japanese patent application no. 2005-282246, filed Sep. 28, 2005, entitled "WIRING PATTERN DETERMINATION METHOD AND COMPUTER PROGRAM PRODUCT THEREOF."

BACKGROUND OF THE INVENTION

1. Field of the Invention

The present invention relates to a wiring pattern determination method for determining wiring patterns of plated leads in the vicinity of an edge of a semiconductor package having a multi-layered structure, as well as a computer program product for allowing a computer to perform this wiring pattern determination process.

2. Description of the Related Art

A semiconductor package, such as a PBGA or an EBGA, is designed so that electrode terminals of a semiconductor chip are electrically connected with pads (for example, wire bonding pads or flip-chip pads) and the pads are connected with vias (lands) and the vias are also connected with each other by wiring patterns. A designer can design wiring routes of a semiconductor package by trial and error on a virtual plane and using a CAD system but, at this time, this design work takes much time and effort.

In order to solve this problem, as set forth in Japanese Unexamined Patent Publication No. 2002-083006, there has been proposed a technique in which only wiring routes are determined in advance in a rough wiring process and, then, by referring to actual design rules and by checking lines and spaces, automatic wiring is performed uniformly in a wiring formation process.

Figure 16:
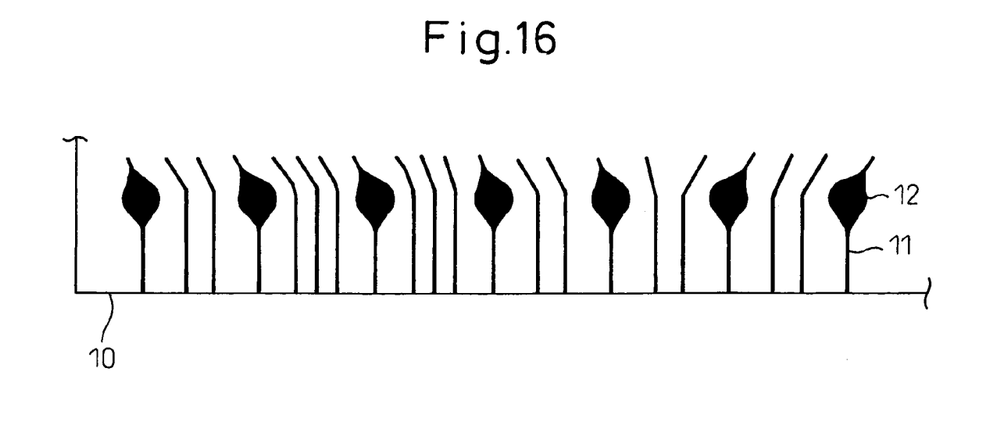
FIG. 16 is a diagram illustrating plated leads located on an edge of a semiconductor package.

On the edges of a semiconductor package, plated leads are wired from terminals to which respective wiring patterns are connected. FIG. 16 is a diagram illustrating plated leads located on an edge of a semiconductor package. In particular, in this figure, there are shown plated leads 11 on one of four edges 10 of a semiconductor package. The plated leads 11 have to be wired in a direction perpendicular to the edge 10 of the semiconductor package.

Such a plated lead wiring method that can easily perform automatic wiring of the plated leads is set forth in Japanese Unexamined Patent Publication No. 2002-149734, as an example.

In a manufacturing stage, a plurality of semiconductor packages are fabricated simultaneously on one large substrate. After the desired wiring patterns are formed, the one substrate, in which the plurality of semiconductor packages are fabricated, is divided into single semiconductor package so that the semiconductor packages are finished as final products.

Further, in recent years, there exists a semiconductor package having a multi-layered structure, in which wiring patterns are formed not only in one layer on a substrate but wiring patterns that are different from each other are formed in a plurality of layers for higher integration.

Figure 17:
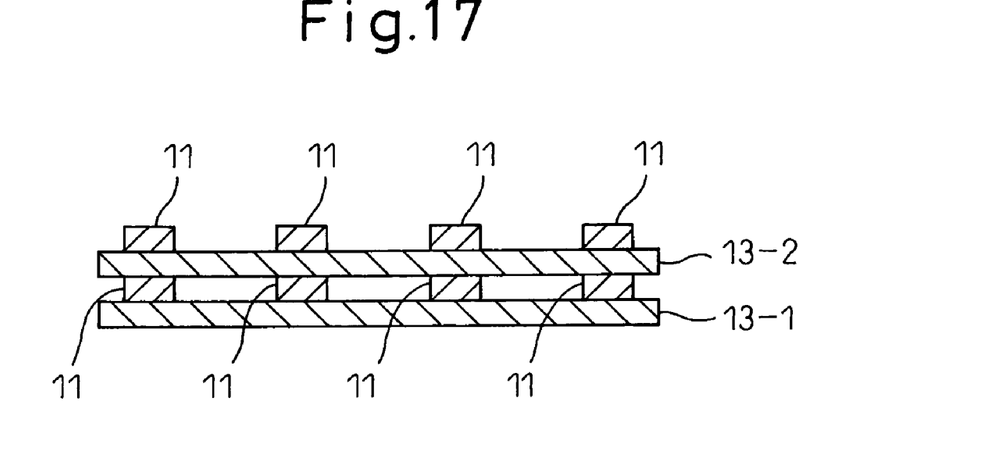
FIG. 17 is a cross-sectional view illustrating a cutting plane on an edge of a semiconductor package having a multi-layered structure in which plated lead positions are overlapped between successive layers.

In the semiconductor package having such multi-layered structure, if plated lead positions on its edge are overlapped between successive layers in a lamination direction, thick and hard portions appear on the substrate and, as a result, when the substrate is divided into each semiconductor package, in a manufacturing stage, burrs may be formed at the divided portions and the plated leads or the substrate itself may be damaged. FIG. 17 is a cross-sectional view illustrating a cutting plane on an edge of a semiconductor package having a multi-layered structure in which plated lead positions are overlapped between successive layers. This figure shows a cross-section of a semiconductor package having a two-layered structure in which plated leads are overlapped in the lamination direction of two substrates 13-1 and 13-2.

Figure 18:
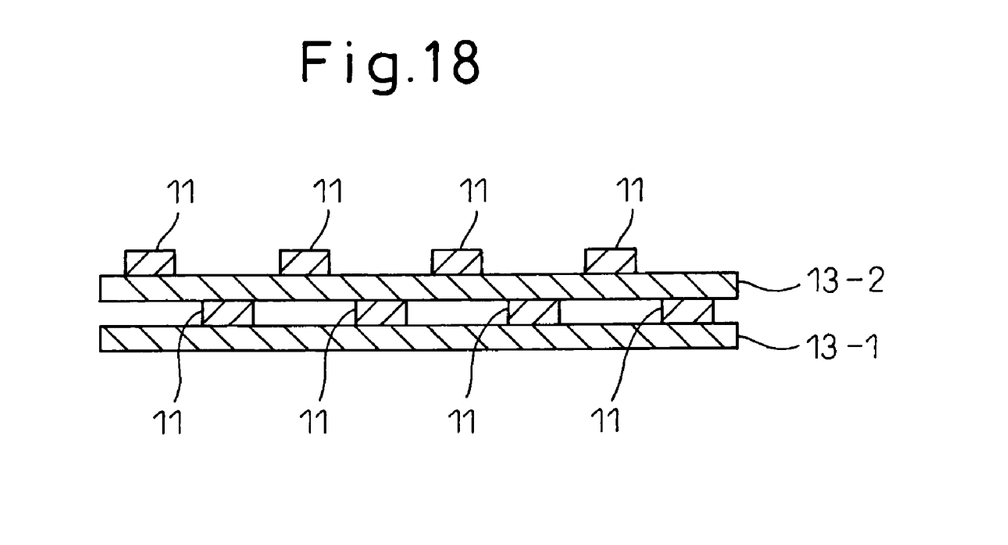
FIG. 18 is a cross-sectional view illustrating a cutting plane on an edge of a semiconductor package having a multi-layered structure in which plated lead positions are not overlapped between successive layers.

In order to avoid the problem in the manufacturing stage of the semiconductor package having the multi-layered structure as described above, the plated lead positions should not overlap on the successive layers. FIG. 18 is a cross-sectional view illustrating a cutting plane on an edge of a semiconductor package having a multi-layered structure in which the plated lead positions are not overlapped between the successive layers. Similarly to FIG. 17, this figure shows a cross-section of a semiconductor package having a two-layered structure. As shown in the figure, the positions of the plated leads 11 are disposed alternately so that the plated lead positions do not overlap on the successive layers of the substrates 13-1 and 13-2 on the edge of the semiconductor package. As a result, when the substrate is divided into single semiconductor packages in the manufacturing stage, burrs are not formed on the divided portions and the cut surfaces can be finished properly.

Conventionally, positions of plated leads on an edge of a semiconductor package having a multi-layered structure are designed by trial and error, or by making and correcting the wiring actually while manipulating a CAD system manually, depending on the designer's experience and intuition. More specifically, first, based on already designed wiring patterns, the positions of the plated leads wired from terminals, to which respective wiring patterns are connected, are designed tentatively. Next, by using the CAD system, the tentatively designed plated lead positions are moved and corrected so that (1) requirements for clearance can be satisfied, (2) the plated lead positions are not overlapped between successive layers, and, further, (3) the resulting plated lead positions are not too different from the tentatively designed plated lead positions and, as a result, optimal plated lead positions are determined.

In such wiring design technique by trial and error, the design quality and the time required for design greatly depend on the designer's skill, experience, intuition and the like. In particular, as the number of layers in the multi-layered structure of the semiconductor package is increased, the effort, time and difficulty for achieving the optimal plated lead positions is increased. For example, even a correction of the plated lead positions in only one layer may affect the plated lead positions in other layers significantly and, therefore, the entire multi-layered structure may often have to be redesigned.

Further, in the case of the semiconductor package having the multi-layered structure, the number of variations of the plated lead positions that can be designed is far more than that in the case of the one-layered semiconductor package and, therefore, it is difficult to automate the design due to its complexity and, after all, such a semiconductor package has to be designed manually by trial and error. In reality, because the manual design by trial and error requires about half a day to three days and it is not economical to waste further time on wiring design, the designer has to compromise with a certain design quality.

In view of the above problems, it is an object of the present invention to provide, in a wiring pattern determination process for determining optimal wiring patterns of plated leads in the vicinity of an edge of a semiconductor package having a multi-layered structure, a wiring pattern determination method for facilitating its process, as well as a computer program product for allowing a computer to perform this wiring pattern determination process.

SUMMARY OF THE INVENTION

In order to achieve the above object, in a wiring pattern determination process according to the present invention, wiring patterns of plated leads in the vicinity of an edge of a semiconductor package having a multi-layered structure are determined by using a template in which positionable windows are arranged so that the positionable windows have a predetermined pitch in a row direction corresponding to an identical layer of the semiconductor package having the multi-layered structure and so that the positionable windows are positioned at least in every other row in a column direction corresponding to a lamination direction of the multi-layered structure. More specifically, the positions of the plated leads on the edge of the semiconductor package are assigned so that each of the plated lead positions can be accommodated in any of the positionable windows in the template and, based on the assigned plated lead positions, the wiring patterns of the plated leads are determined.

Figure 1:
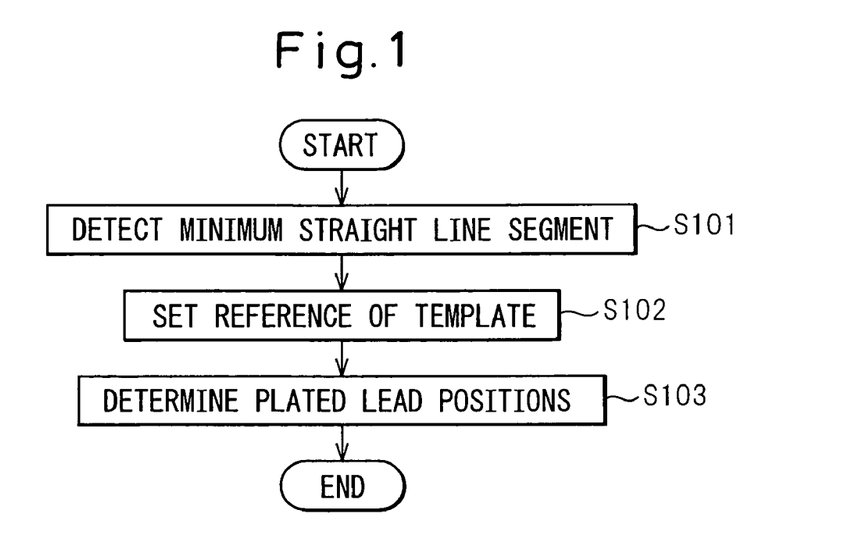
FIG. 1 is a flow chart (part 1) of a wiring pattern determination method according to the present invention.

FIG. 1 is a flow chart (part 1) of a wiring pattern determination method according to the present invention.

Typically, after desired wiring patterns are formed on a semiconductor package, with respect to plated leads wired from terminals, to which these wiring patterns are connected, plated lead positions on an edge of the semiconductor package are designed. In this specification, the design of the plated lead positions at this stage is particularly referred to as "the tentative design of the plated lead positions" and this tentative design is distinguished from "the design according to the present invention" wherein the tentatively designed plated lead positions are corrected to optimal plated lead positions. In this connection, the optimal lead positions defined herein are positions that are not overlapped between successive layers and it is preferable that the plated lead positions are disposed at least in every other layer in a lamination direction of the multi-layered structure of the semiconductor package.

The wiring pattern determination method according to the present invention comprises a determination step S103 for moving the positions of the tentatively designed plated leads on the edge of the semiconductor package to the positions that can be accommodated in positionable windows nearest to the positions of the respective tentatively designed plated leads in a template in which the positionable windows are arranged so that the positionable windows have a predetermined pitch in a row direction corresponding to an identical layer of the multi-layered structure of the semiconductor package and so that the positionable windows are positioned at least in every other row in a column direction corresponding to a lamination direction of the multi-layered structure and, then, determining the moved positions as the optimal positions of the plated leads.

Prior to performing the determination step S103 for the plated lead positions, a detection step S101 for a minimum straight line segment and a reference setting step S102 for the template are performed.

Among these, in the detection step S101 for the minimum straight line segment, among the tentatively designed plated leads, a plated lead that has the shortest straight line section orthogonal to the edge of the semiconductor package is detected as the minimum straight line segment. This minimum straight line segment is selected from the plated leads included in a layer having the smallest area in which the positions of the tentatively designed plated leads can be moved.

Further, in the reference setting step S102 for the template, in the process to move the positions of the tentatively designed plated leads by using the template (or, in other words, in the process in the determination step S103 for the plated lead positions), a position that acts as a reference for such a template is set as the position of the minimum straight line segment. In particular, in this reference setting step S102 for the template, the reference is set so that the minimum straight line segment can be surely positioned in any one of the positionable windows in the template.

After performing these detection step S101 for the minimum straight line segment and the reference setting step S102 for the template, the determination step S103 moves the positions of the tentatively designed plated leads based on the template, the reference point of which is set in the reference setting step S102, and determines the moved positions as the optimal positions of the plated leads.

Based on the optimal plated lead positions determined in the determination step S103, the wiring patterns of the plated leads are determined by using a "convex hull" algorithm as described with reference to FIG. 2.

Figure 2:
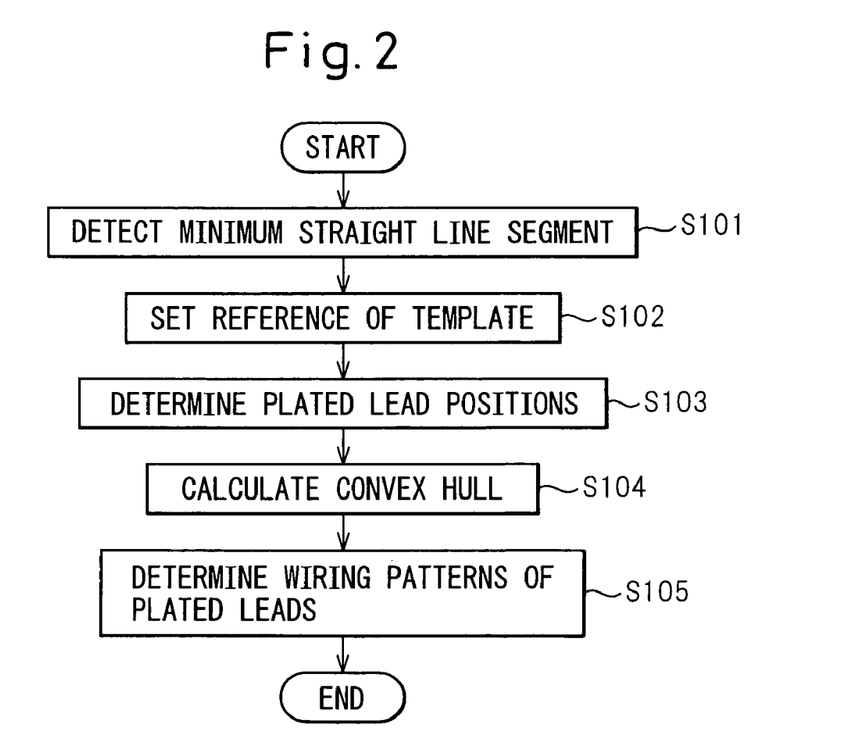
FIG. 2 is a flow chart (part 2) of a wiring pattern determination method according to the present invention.

FIG. 2 is a flow chart (part 2) of a wiring pattern determination method according to the present invention.

In a calculation step S104 for a convex hull, assuming that a central point of a substrate surface of a semiconductor package is located inside when the convex hull is calculated, clearance positions of vias and/or outermost contours of obstacles existing in the vicinity of an edge of the semiconductor package are set as vertexes and, based on these vertexes, the convex hull is calculated.

In a determination step S105 for the wiring patterns of the plated leads, the wiring patterns of plated lead sections existing outside the convex hull that is calculated in the calculation step S104 are determined so that the plated leads are wired from the optimal positions of the plated leads determined in the determination step S103.

Here, the processes in the detection step S101 for the minimum straight line segment, the reference setting step S102 for the template and the determination step S103 for the plated lead positions are identical to those shown in FIG. 1 and, therefore, like elements are designated by like reference numerals and a description is omitted.

The detection step S101 for the minimum straight line segment, the reference setting step S102 for the template, the determination step S103 for the plated lead positions, the calculation step S104 for the convex hull and the determination step S105 for the wiring patterns of the plated leads in the wiring pattern determination method according to the invention can be implemented in the form of a software program product that can be operated by an arithmetic processing unit such as a computer. An apparatus for performing the above-mentioned processes and a computer program product for allowing the computer to perform the above-mentioned processes can be implemented easily by those skilled in the art who understand the following description. Further, it would be evident to those skilled in the art that the computer program product for allowing the computer to perform the above-mentioned processes may be stored in storage media.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

According to the present invention, wiring patterns of plated leads in the vicinity of an edge of a semiconductor package having a multi-layered structure are determined by using a template where positionable windows, in which plated lead positions are disposed, are arranged according to predetermined rules. First, this template will be described with reference to FIG. 3.

Figure 3:
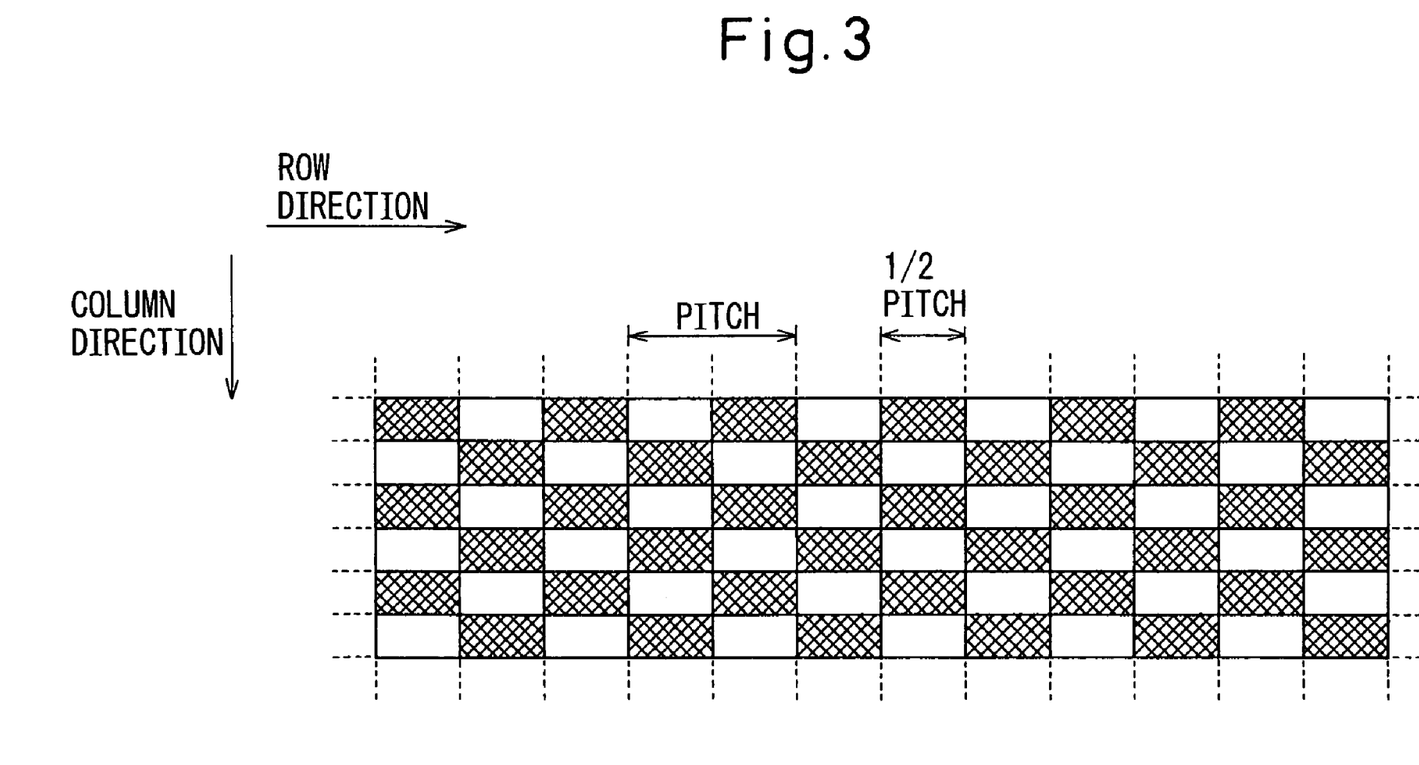
FIG. 3 is a diagram for conceptually describing a template used in an embodiment of the present invention.

FIG. 3 is a diagram for conceptually describing a template used in an embodiment of the present invention. In the figure, positionable windows are indicated by white boxes and portions other than the positionable windows are indicated by black boxes.

The template is a kind of reference table, represented in a matrix form, for defining positions where the plated lead positions can be disposed. The template is generated individually for each of four edges of the semiconductor package.

A row direction of the template corresponds to a direction along an identical layer of the semiconductor package having the multi-layered structure and a column direction of the template corresponds to a lamination direction of the multi-layered structure of the semiconductor package. The positionable windows where the plated lead positions can be disposed are arranged so that the positionable windows have a predetermined pitch in the row direction of the template and so that the positionable windows are positioned at least in every other row in the column direction of the template. The pitch has to correspond to at least a design clearance. The number of the columns of the template may be equal to or more than the number of the layers of the multi-layered structure of the semiconductor package. On the other hand, the number of the rows of the template may be equal to or more than a value obtained by dividing the length of one of four edges of the semiconductor package by one-half the length of the pitch.

In this embodiment, guided by such a template, the positions of the plated leads that have been tentatively designed in advance are moved to the optimal positions and, at this time, a reference point of the template is set by using a minimum straight line segment that has been detected in advance. Here, the detection of the minimum straight line segment will be described with reference to FIG. 4.

Figure 4:
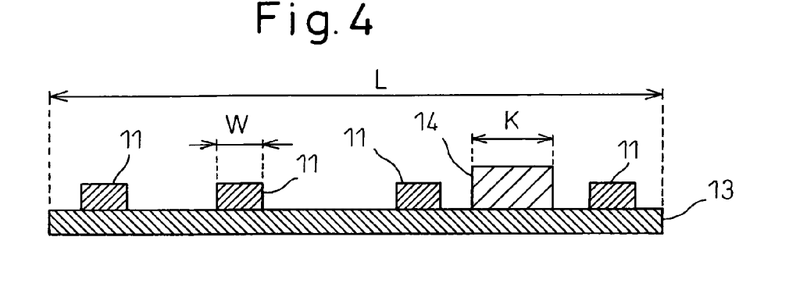
FIG. 4 is a cross-sectional view illustrating a cutting plane on an edge of a semiconductor package that is intended for describing detection of a minimum line segment used for setting a reference point of a template in an embodiment of the present invention.

FIG. 4 is a cross-sectional view illustrating a cutting plane on an edge of a semiconductor package that is intended for describing detection of a minimum line segment used for setting a reference point of a template in an embodiment of the present invention. As an example, a case in which four plated leads 11 and one obstacle exist on one edge of a substrate 13 of a semiconductor package will be described.

In this embodiment, among tentatively designed plated leads, a plated lead that has the shortest straight line section orthogonal to the edge of the semiconductor package is detected as the minimum straight line segment. This minimum straight line segment is selected from the plated leads included in the layer having the smallest area in which the positions of the tentatively designed plated leads can be moved.

Specifically, the layer having the smallest area in which the tentatively designed plated lead positions can be moved is detected as follows. As shown in FIG. 4, assuming that the length of one of four edges of the substrate 13 of the semiconductor package is L, the width of one of the plated leads 11 is W, the number of the plated leads is n (n=4 in this embodiment) and the width of the obstacle tangent to the cutting plane on the edge of the semiconductor package is K, the length S of the area in which the tentatively designed plated lead positions can be moved in the cutting plane on the edge of the semiconductor package can be expressed by the formula (1):

$$S = L - K - W \times n \quad (1)$$

This parameter S is calculated with respect to each of the layers of the multi-layered structure and, among these, the layer having the smallest value of the parameter S is detected as "the layer having the smallest area in which the positions of the tentatively designed plated leads can be moved".

Next, from the plated leads included in "the layer having the smallest area in which the plated lead positions can be moved" that has been detected as described above, a plated lead that has the shortest straight line section orthogonal to the edge of the semiconductor package is selected and determined as the minimum straight line segment.

Here, it is to be noted that the template is generated for each of four edges of the semiconductor package and, therefore, "the layer having the smallest area in which the positions of the tentatively designed plated leads can be moved" and the minimum straight line segment included in this layer are also generated for each of the four edges of the semiconductor package.

The position of the minimum straight line segment detected as described above is set as a reference point for assigning the tentatively designed plated lead positions so that each plated lead position is accommodated in any of the positionable windows in the template. Therefore, this minimum straight line segment should be positioned in at least one of the positionable windows in the template.

Figure 5A:
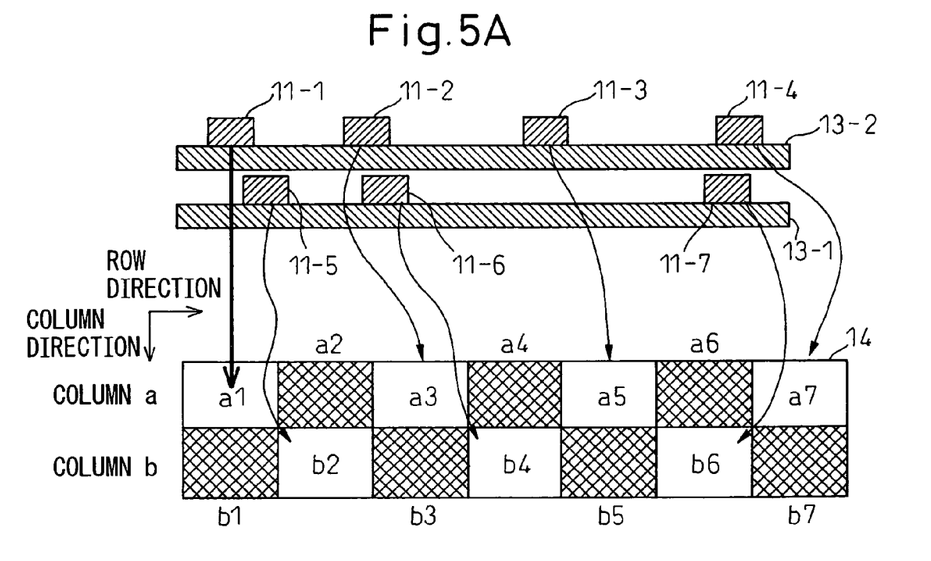
FIGS. 5A and 5B are cross-sectional views illustrating a cutting plane on an edge of a semiconductor package that is intended for describing movement of tentatively designed plated lead positions by using a template in an embodiment of the present invention.
Figure 5B:
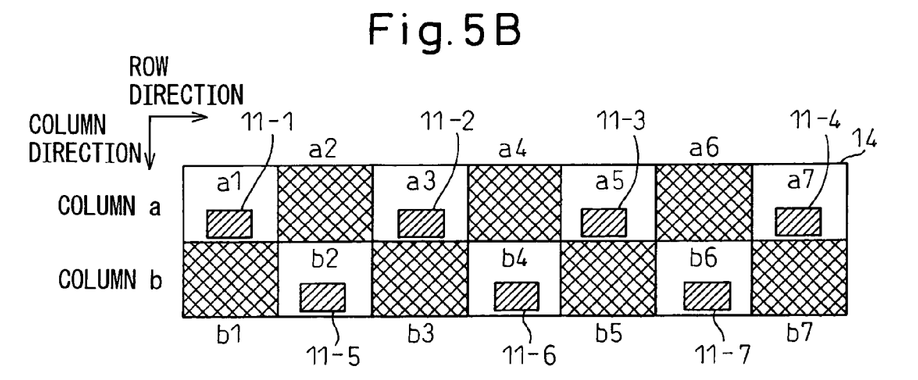

After the reference point of the template is set as described above, the tentatively designed plated lead positions are moved to the positions that can be accommodated in the positionable windows nearest to the respective tentatively designed plated lead positions. FIGS. 5A and 5B are cross-sectional views illustrating a cutting plane on an edge of a semiconductor package that is intended to describe movement of tentatively designed plated lead positions by using a template in an embodiment of the present invention. As an example, as shown in FIG. 5A, a case in which seven tentatively designed plated leads 11-1, 11-2, 11-3, 11-4, 11-5, 11-6 and 11-7 exist on one edge of substrates 13-1 and 13-2 of a semiconductor package having a two-layered structure and the plated lead 11-1 is detected as a minimum straight line segment, will be described.

As shown in FIG. 5A, the template 14 has two columns a and b corresponding to the two-layered structure of the semiconductor package. As described above, the positionable windows are arranged in the template so that the positionable windows have a predetermined pitch in a row direction and so that the positionable windows are positioned at least in every other row in a column direction. In the example shown in FIG. 5A, the positionable windows a1, a3, a5 and a7 are arranged in the row direction of the column a of the template 14 and the positionable windows b2, b4 and b6 are arranged in the row direction of the column b.

Because the plated lead 11-1 is the minimum straight line segment, in the example shown in FIG. 5A, the positionable window a1 is set as the reference point of the template 14 and, as shown in FIG. 5B, the position of the plated lead 11-1 is set so that it can be unfailingly positioned in the positionable window a1. As described above, after the reference point of the template 14 is set, the positions of the tentatively designed plated leads are moved to the positions that can be accommodated in the positionable windows nearest to the respective tentatively designed plated lead positions. More specifically, as shown in FIG. 5B, with respect to the plated leads existing on the substrate 13-2, the position of the plated lead 11-2 is assigned to the positionable window a3, the position of the plated lead 11-3 is assigned to the positionable window a5, and the position of the plated lead 11-4 is assigned to the positionable window a7. On the other hand, with respect to the plated leads existing on the substrate 13-1, the position of the plated lead 11-5 is assigned to the positionable window b2, the position of the plated lead 11-6 is assigned to the positionable window b4, and the position of the plated lead 11-7 is assigned to the positionable window b6.

As described above, by determining the plated lead positions by using the template, the plated lead positions can be disposed in the positions that are not overlapped between successive layers.

When the tentatively designed plated lead positions are moved to the positions in the positionable windows nearest to the respective lead positions, it is preferable that the positions in the positionable windows deviate from the tentatively designed plated lead positions as little as possible. This is because, if the plated leads are moved largely, the entire wiring patterns that have already been designed may have to be significantly corrected. Therefore, in this embodiment, in order to prevent such a situation, the plated lead positions in the positionable windows are corrected so that such plated lead positions are disposed more optimally. This correction will be described with reference to FIGS. 6A and 6B.

Figure 6A:
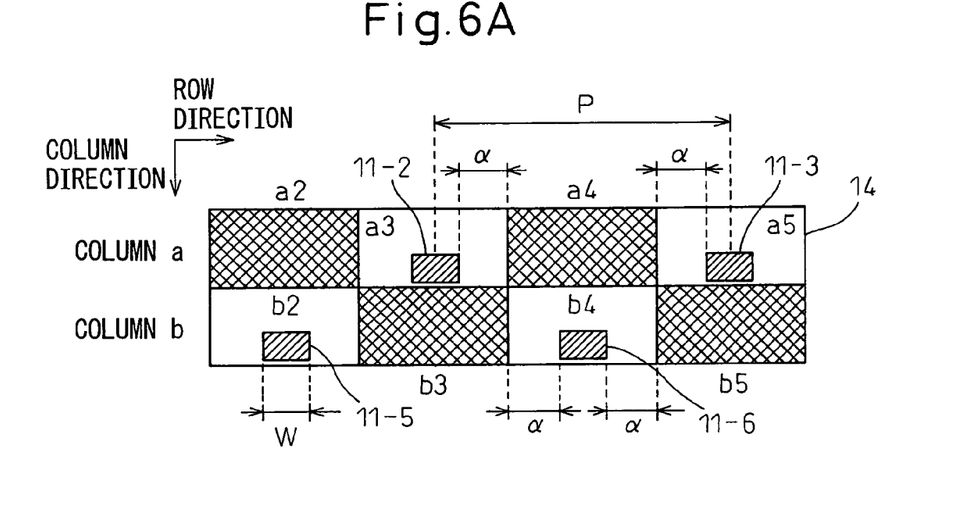
FIGS. 6A and 6B are cross-sectional views illustrating a cutting plane on an edge of a semiconductor package that is intended for describing the correction of plated lead positions in positionable windows in an embodiment of the present invention.
Figure 6B:
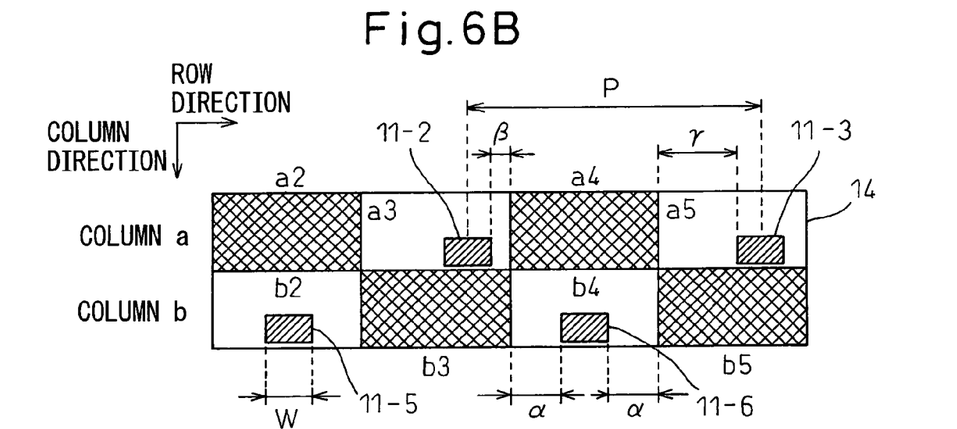

FIGS. 6A and 6B are cross-sectional views illustrating a cutting plane on an edge of a semiconductor package that is intended for describing correction of plated lead positions in positionable windows in an embodiment of the present invention. As an example, as shown in FIG. 6A, a case in which positions of plated leads 11-2, 11-3, 11-5 and 11-6 of a semiconductor package having a two-layered structure are disposed in the vicinity of centers of positionable windows a3, a5, b2 and b4 in a template 14, respectively, will be described.

As shown in FIG. 6A, assuming that the pitch of arrangement of the positionable windows in a row direction of the template 14 is P and the width of one of the plated leads is W, the distance α by which the plated lead position can be moved in one positionable window can be expressed by the formula (2):

$$\alpha = (P - 2 \times W)/4 \quad (2)$$

Therefore, the plated lead position in the positionable window can be fine adjusted within the distance α that satisfies the formula (2).

For example, as shown in FIG. 6B, when the position of the plated lead 11-2 exists in the positionable window a3, the position of the plated lead 11-2 can be moved by the distance α at the maximum. At this time, at least the pitch P has to be maintained between the adjacent plated leads 11-2 and 11-3 and, therefore, the position of the plated lead 11-3 is moved at least by the distance by which the position of the plated lead 11-2 has been moved in the direction of movement of the plated lead 11-2. Here, in the example shown in FIG. 6B, a relationship of $P = \beta + W + \gamma$ holds.

The pitch of the arrangement of the positionable windows in the row direction of the template has to correspond to at least a design clearance. Therefore, as this pitch is increased, exceeding the design clearance, the distance by which the plated leads can be moved in the positionable windows in the above-mentioned correction process is increased. Or, in other words, the larger design clearance corresponds to the relatively smaller width of the plated lead and, therefore, as this pitch is reduced, becoming less than the width of the plated lead, the distance by which the plated leads can be moved in the positionable windows in the above-mentioned correction process is increased. Here, this distance will be described with reference to FIGS. 7A-8B.

Figure 7:
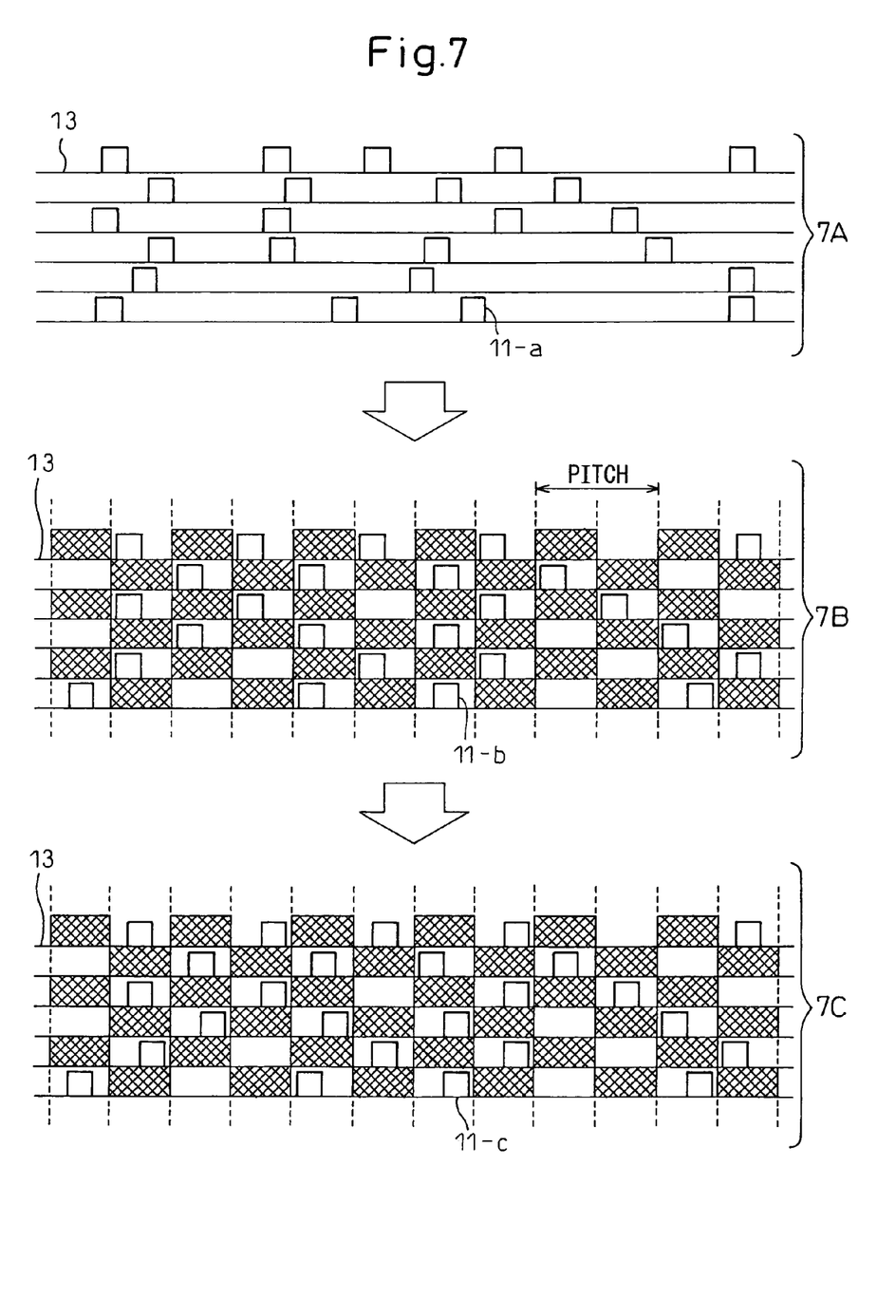
FIGS. 7 and 8 are cross-sectional views illustrating a cutting plane on an edge of a semiconductor package that is intended for describing distances by which plated lead positions can be moved in positionable windows in an embodiment of the present invention.

FIG. 7 is cross-sectional views (part 1) illustrating a cutting plane on an edge of a semiconductor package that is intended for describing distances by which plated lead positions can be moved in positionable windows in an embodiment of the present invention. As an example, a case in which each of plated leads (indicated by squares in the figures) on substrates 13 of a semiconductor package having a six-layered structure is smaller than the pitch of arrangement of positionable windows in a row direction of a template and the plated leads are tentatively designed as shown in reference number 7A will be described. In this case, plated lead positions as shown in reference number 7B can be obtained by applying the wiring pattern determination process according to the present invention, but, for example, the position of the plated lead 11-*b* deviates significantly from the tentatively designed plated lead position 11-*a*. Therefore, as shown in reference number 7C, this plated lead is moved to the plated lead position 11-*c* and this position is determined as an optimal plated position.

Figure 8:
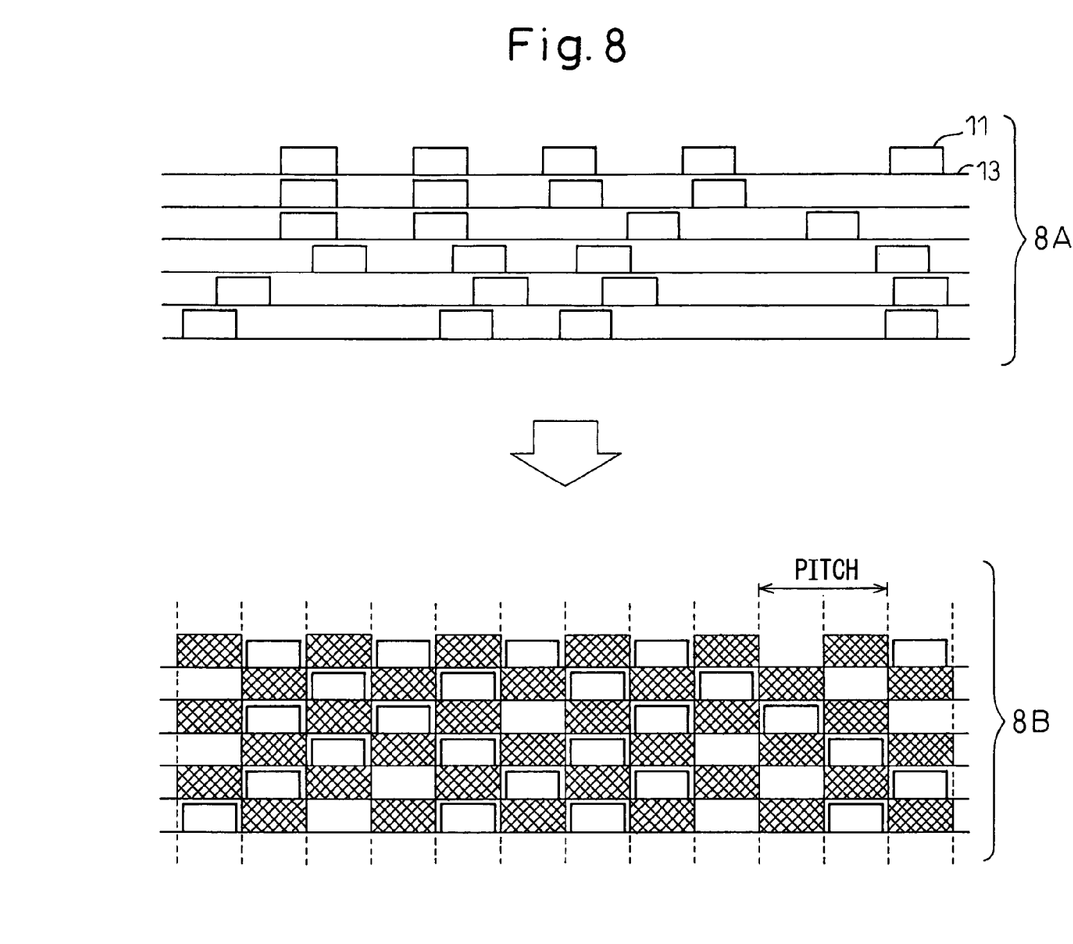

FIG. 8 is a cross-sectional views (part 2) illustrating a cutting plane on an edge of a semiconductor package that is intended for describing distances by which plated lead positions can be moved in positionable windows in an embodiment of the present invention. As an example, a case in which each of plated leads (indicated by squares in the figures) on substrates 13 of a semiconductor package having a six-layered structure has a width that is about one-half the pitch of arrangement of positionable windows in a row direction of a template and the plated leads are tentatively designed as shown in reference number 8A will be described. In this case, plated lead positions as shown in reference number 8B can be obtained by applying the wiring pattern determination process according to the present invention. However, because the width of the plated lead is about one-half the pitch of the arrangement of the positionable windows in the row direction of the template, there is no space where the plated lead positions can be moved in the positionable windows. Therefore, the plated lead positions shown in reference number 8B are not moved and are determined to be optimal plated lead positions.

Though the semiconductor package having the two-layered structure is exemplified in the above description, in the case of a multi-layered structure having more than two layers, the above-described processes may be repeated sequentially for adjacent layers.

In this embodiment, based on the plated lead positions determined as described above, wiring patterns of the plated leads are determined by using a convex hull algorithm. Here, the determination of the wiring patterns of the plated leads will be described with reference to FIGS. 9 to 11.

Figure 9:
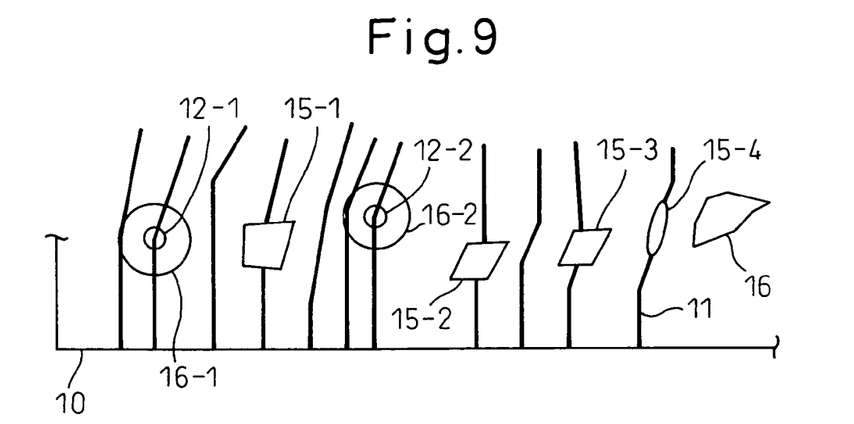
FIGS. 9 to 11 are diagrams for describing determination of wiring patterns of plated leads in an embodiment of the present invention.
Figure 10:
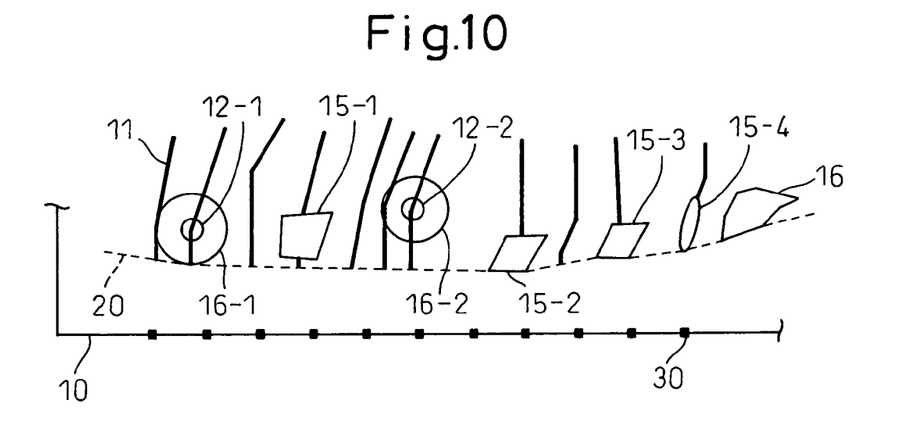
Figure 11:
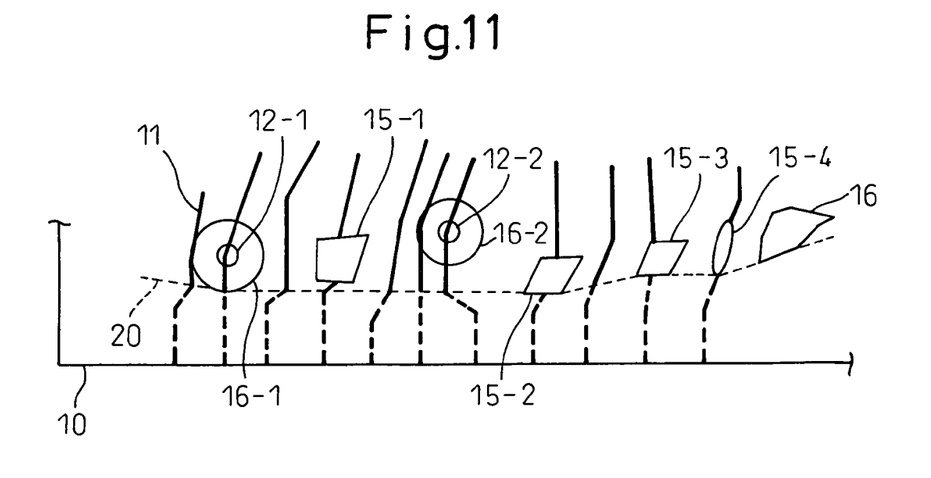

FIGS. 9 to 11 are diagrams for describing determination of wiring patterns of plated leads in an embodiment of the present invention. Here, though these figures show only one layer in a semiconductor package having a multi-layered structure, it should be understood that the wiring patterns of the plated leads should be determined in each layer.

As shown in FIG. 9, a case in which plated leads 11 are tentatively designed, in the vicinity of one of four edges 10 of a semiconductor package, will be described. As shown in the figure, it is assumed that vias 12-1 and 12-2, wire bonding pads 15-1, 15-2, 15-3 and 15-4, and a plane 16 exist in the vicinity of the edge 10 of the semiconductor package. It is also assumed that the wiring pattern determination process according to the present invention that has already been described is performed with respect to the tentatively designed plated leads shown in FIG. 9 and optimal positions 30 of the plated leads are determined as shown in FIG. 10.

In this embodiment, a central point on a substrate surface of the semiconductor package is set as the "inside" for calculating a convex hull and clearance positions 16-1 and 16-2 of the vias 12-1 and 12-2, respectively, and outermost contours of the wire bonding pads 15-1, 15-2, 15-3 and 15-4 and the plane 16 are set as vertexes and, based on these vertexes, the convex hull is calculated. This convex hull is indicated by a dotted line in FIG. 10.

Here, it is to be noted that, with respect to the vias, the clearance positions are set as the vertexes for calculating the convex hull as described above. This prevents the plated leads from bending in areas where the clearance cannot be secured. Further, with respect to the polygonal obstacles such as the wire bonding pads, planes and the like, the vertexes that are the outermost contours from the central point on the substrate surface of the semiconductor package are used for calculating the convex hull.

Next, as shown in FIG. 11, the wiring patterns of plated lead sections existing "outside" the calculated convex hull are determined. The wiring patterns of the plated leads existing outside the convex hull can be wired freely so long as requirements for design clearance can be satisfied. In FIG. 11, an example of the determined wiring patterns of the plated leads is shown by thick dotted lines.

If the wiring patterns of the plated leads are determined as described above, the plated lead positions will not overlap between successive layers on a cutting plane on the edge of the semiconductor package. As a result, when the substrate is divided into each semiconductor package in the manufacturing stage, burrs are hardly formed on the divided portions and the cut surfaces can be finished properly.

Figure 12:
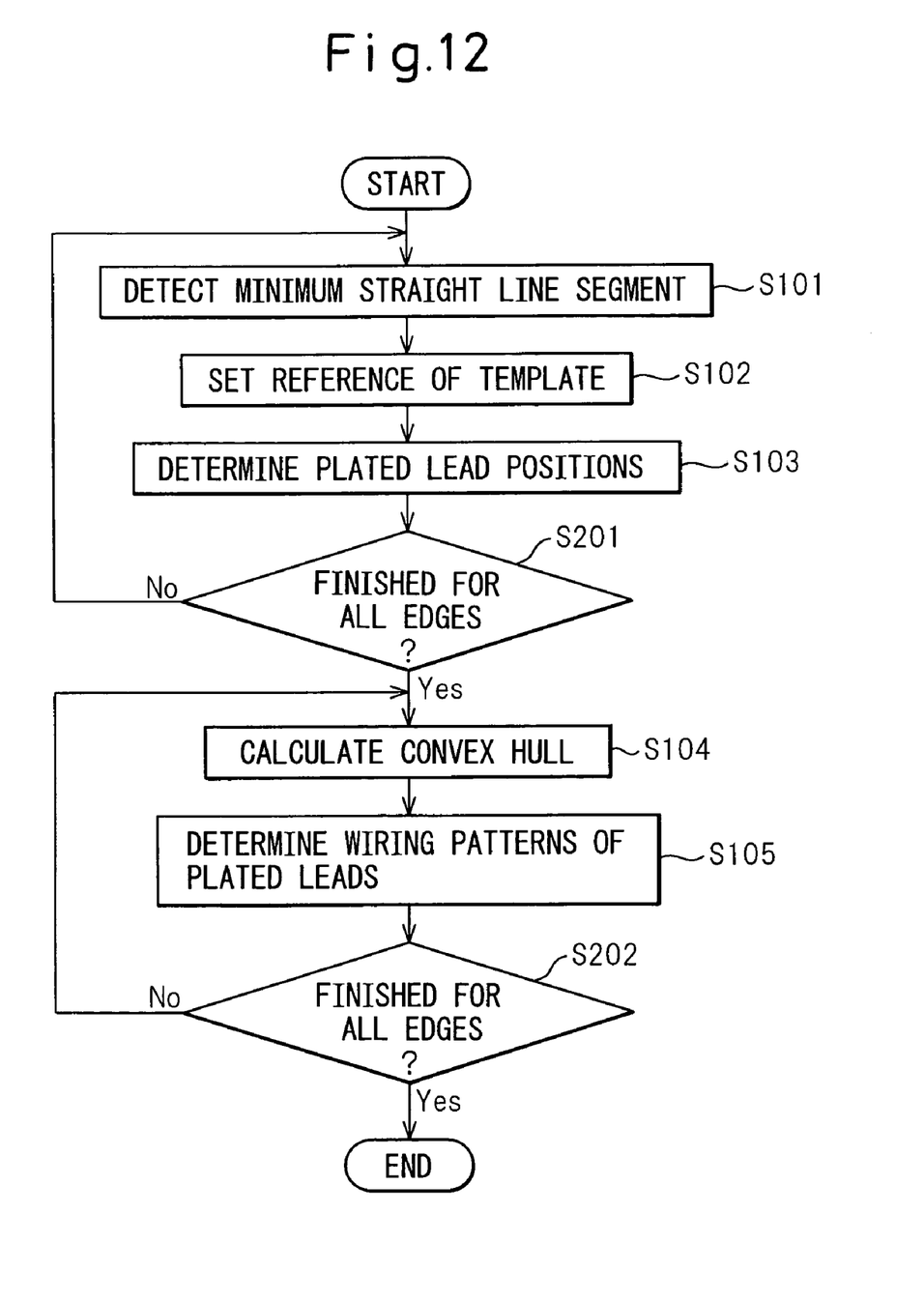
FIG. 12 is a flow chart for describing a first variation of a sequence of performing processes in a wiring pattern determination process according to an embodiment of the present invention.
Figure 13:
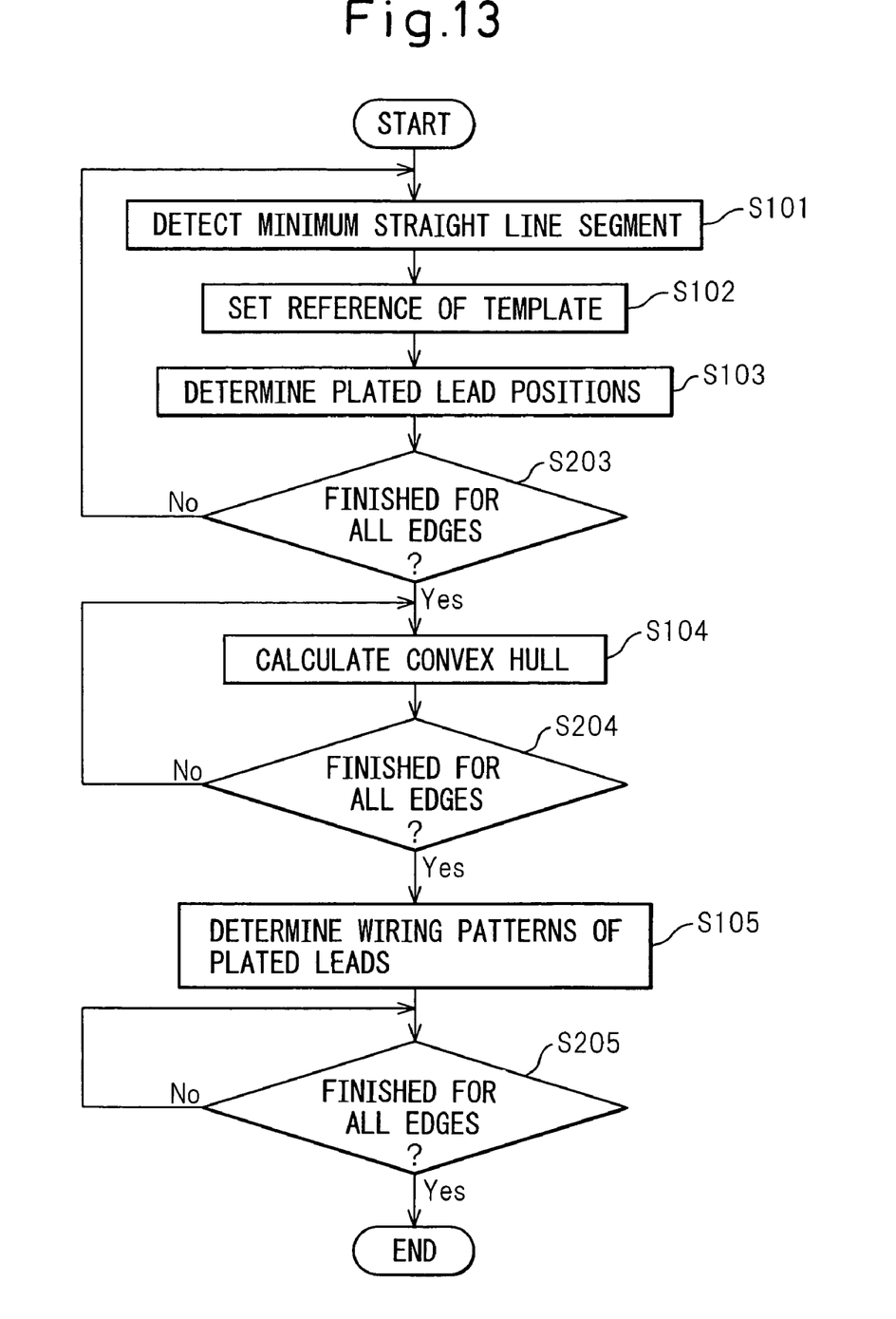
FIG. 13 is a flow chart for describing a second variation of a sequence of performing processes in a wiring pattern determination process according to an embodiment of the present invention.
Figure 14:
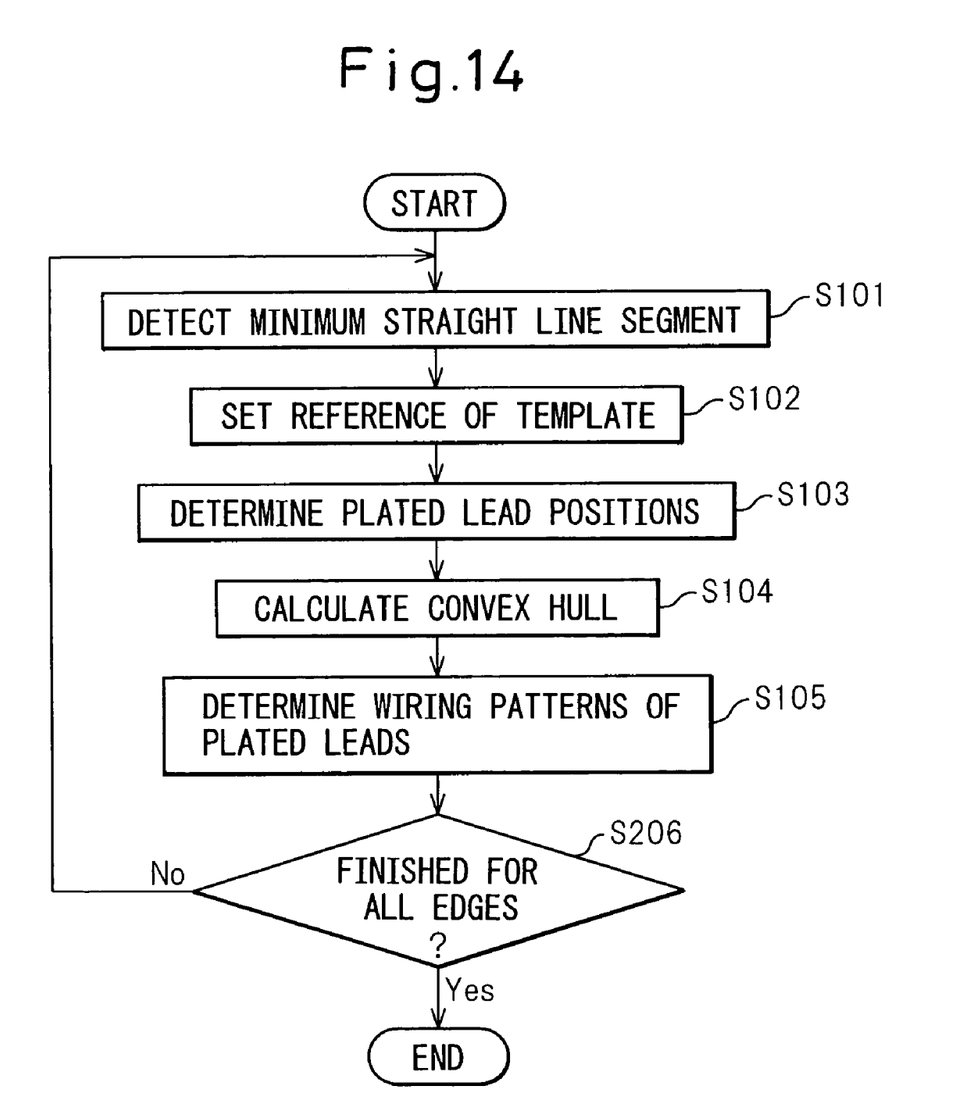
FIG. 14 is a flow chart for describing a third variation of a sequence of performing processes in a wiring pattern determination process according to an embodiment of the present invention.

A sequence of performing processes in the wiring pattern determination process described above will be described with reference to FIGS. 12-14. FIGS. 12 to 14 are flow charts for describing first to third variations of a sequence of performing processes in a wiring pattern determination process according to an embodiment of the present invention.

In the first variation shown in FIG. 12, the detection step S101 for the minimum straight line segment, the reference setting step S102 for the template and the determination step S103 for the plated lead positions that are described with reference to FIG. 2 are performed for each of four edges of a semiconductor package and, then, after all the plated lead positions are determined for the four edges, the calculation step S104 for the convex hull and the determination step S105 for the wiring patterns of the plated leads are performed for each of the four edges of the semiconductor package. More specifically, after the determination step S103 for the plated lead positions is performed, in step S201, it is determined whether the plated lead positions are determined for all (that is to say, four) edges or not and, at this time, if the plated lead positions are determined for all the edges, the process proceeds to the calculation step S104 for the convex hull. Then, after the determination step S105 for the wiring patterns of the plated leads is performed, in step S202, it is determined whether the wiring patterns of the plated leads are determined for all the edges or not and, at this time, if the wiring patterns of the plated leads are determined for all the edges, the process terminates.

In the second variation shown in FIG. 13, the detection step S101 for the minimum straight line segment, the reference setting step S102 for the template and the determination step S103 for the plated lead positions are performed for each of four edges of a semiconductor package and, then, after all the plated lead positions are determined for the four edges, the calculation step S104 for the convex hull is performed for each of the four edges of the semiconductor package and, further, after the convex hulls for the four edges are calculated, the determination step S105 for the wiring patterns of the plated leads is performed for each of the four edges of the semiconductor package. More specifically, after the determination step S103 for the plated lead positions is performed, in step S203, it is determined whether the plated lead positions are determined for all (that is to say, four) edges or not and, if the plated lead positions are determined for all the edges, the process proceeds to the calculation step S104 for the convex hull. Then, after the calculation step S104 for the convex hull is performed, in step S204, it is determined whether the convex hulls are calculated for all (that is to say, four) edges or not and, if the convex hulls are calculated for all the edges, the process proceeds to the determination step S105 for the wiring patterns of the plated leads. Then, after the determination step S105 for the wiring patterns of the plated leads is performed, in step S205, it is determined whether the wiring patterns of the plated leads are determined for all the edges or not and, if the wiring patterns of the plated leads are determined for all the edges, the process terminates.

In the third variation shown in FIG. 14, the detection step S101 for the minimum straight line segment, the reference setting step S102 for the template, the determination step S103 for the plated lead positions, the calculation step S104 for the convex hull and the determination step S105 for the wiring patterns of the plated leads are performed collectively for four edges of a semiconductor package. More specifically, after the determination step S105 for the wiring patterns of the plated leads is performed, in step S206, it is determined whether the wiring patterns of the plated leads are determined for all (that is to say, four) edges or not and, if the wiring patterns of the plated leads are determined for all the edges, the process terminates.

Figure 15:
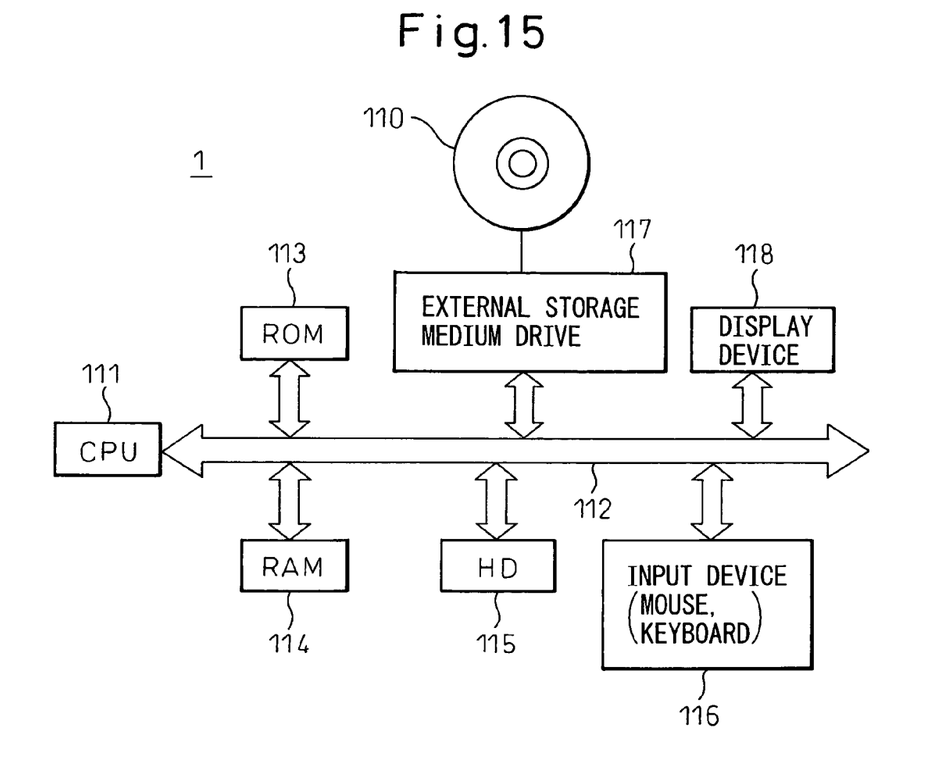
FIG. 15 is a block diagram showing a configuration of a wiring pattern determination apparatus of an embodiment of the present invention that operates according to a program that is stored on a storage medium.

A computer program product for allowing a computer to perform the wiring pattern determination program described above is installed in the computer and operates as a wiring pattern determination apparatus. FIG. 15 is a block diagram showing a configuration of a wiring pattern determination apparatus of an embodiment of the present invention that operates according to a program that is stored on a storage medium.

As shown in FIG. 15, the program for allowing the computer to perform the wiring pattern determination process according to the present invention is stored on a storage medium (an external storage medium such as a flexible disk, a CD-ROM and the like) 110.

A CPU 111 controls the wiring pattern determination apparatus 1 entirely. This CPU 111 is connected with a ROM 113, a RAM 114, an HDD (hard disk drive) 115, an input device 116 such as a mouse, a keyboard and the like, an external storage medium drive 117, and a display device 118 such as a LCD, a CRT and the like, through a bus 112. A control program for the CPU 111 is stored in the ROM 113.

The computer program product for performing the wiring pattern determination process according to the present invention (a wiring pattern determination process program) is installed (stored) from the storage medium 110 on the HDD 115. Further, in the RAM 114, a working area for the CPU 111 to perform the wiring pattern determination process and an area for storing a portion of the program for performing the wiring pattern determination process are secured. Moreover, in the HDD 115, input data, final data and, further, an OS (operating system) and the like are stored in advance.

First, when the computer is turned on, the CPU 111 reads the control program from the ROM 110 and, further, reads the OS from the HDD 115 to start the OS. As a result, the computer is ready to install the wiring pattern determination process program from the storage medium 110.

Next, the storage medium 110 is mounted on the external storage medium drive 117 and a control command is input from the input device 116 to the CPU 111 to read the wiring pattern determination process program stored in the storage medium 110 and store it in the HDD 115 and the like. Thus, the wiring pattern determination process program is installed on the computer.

After that, once the wiring pattern determination process program is activated, the computer operates as the wiring pattern determination apparatus. An operator can perform the wiring pattern determination process described above by manipulating the input device 116 according to working details and procedures through an interaction indicated on the display device 118. Data about the wiring patterns of the plate leads obtained as a result of the process may be, for example, stored on the HDD 115 for utilization in the future, or may be used to indicate the results of the process on the display device 118 visually.

Here, though the program stored in the storage medium 110 is installed on the HDD 115 in the computer of FIG. 15, the present invention is not limited to such implementation and the program may be installed on the computer through an information transmission medium such as a LAN and the like or the program may be installed in advance in the HDD 115 built in the computer.

The positions of the plated leads can be determined automatically by allowing the computer to perform the computer program described above and, apart from this, other embodiments are possible as follows.

As one embodiment, tentatively designed plated lead positions may be indicated on a display screen of a CAD system and a template according to the present invention may be indicated automatically on the same display screen and, on the other hand, a designer may assign the plated lead positions by manipulating a mouse or other pointing device while viewing this display screen.

Further, as the other embodiment, plated lead positions may be assigned manually by holding a template according to the present invention comprised of, for example, a transparent acrylic sheet and the like to tentatively designed plated lead positions that are printed out on a paper.

The present invention can be applied to determination of wiring patterns of plated leads in the vicinity of an edge of a semiconductor package having a multi-layered structure. According to the present invention, the wiring pattern determination process of the plated leads can be facilitated and, in particular, the design can be automated by computer computation.

The wiring pattern determination process according to the present invention can be applied with respect to tentatively designed plated lead positions after desired wiring patterns are formed on a semiconductor package so that optimal plated lead positions can be determined. The optimal plated lead positions defined herein are positions that are not overlapped between successive layers. As a result, when the substrate is divided into each semiconductor package in the manufacturing stage, burrs are hardly formed on the divided portions and the cut surfaces can be finished properly.

Further, according to the present invention, the optimal wiring patterns of the plated leads can be readily designed in a short time without being influenced by the designer's skill, experience, intuition and the like as in the related art and, further, without being restricted by shapes, disposed positions and angles and the like of the plated leads and obstacles existing on the substrate. For example, according to the present invention, the optimal wiring patterns of the plated leads, which were designed by taking about half a day to three days in the related-art manual design by trial and error, can be designed automatically within about ten minutes by using a computer. As a result of the reduction of design time and the burden on the designer, manufacturing costs of products can also be reduced. The optimal wiring patterns of the plated leads can be manufactured more easily because of their regular arrangement and they have a lower rate of occurrence of product errors in the manufacturing process.

What is claimed is:

1. A processor-implemented method for determining optimal wiring patterns of plated leads in the vicinity of an edge of a semiconductor package having a multi-layered structure by computation, comprising:
   a determination step of moving, by a processor, positions of tentatively designed plated leads on said edge to the positions that can be accommodated in positionable windows nearest to the positions of the respective tentatively designed plated leads in a template in which said positionable windows are arranged so that said positionable windows have a predetermined pitch in a row direction corresponding to an identical layer of said multi-layered structure and so that said positionable windows are positioned at least in every other row in a column direction corresponding to a lamination direction of said multi-layered structure;
   a detection step of, among said tentatively designed plated leads, detecting by the processor, a plated lead that has the shortest straight line section orthogonal to the edge of said semiconductor package as a minimum straight line segment; and
   a reference setting step of setting, by the processor, a position that acts as a reference of said template when the positions of said tentatively designed plated leads are moved in said determination step, as the position of said minimum straight line segment, so that said minimum straight line segment can be surely positioned in any one of said positionable windows in said template,
   wherein said determination step moves the positions of said tentatively designed plated leads based on said template, the reference point of which is set in said reference setting step; and
   determining, by the processor, the moved positions as the optimal positions of said plated leads.

2. A method according to claim 1, wherein said detection step detects said minimum straight line segment from the plated leads included in a layer having the smallest area
   in which the positions of said tentatively designed plated leads can be moved.

3. A method according to claim 1, wherein said determination step moves the positions of said tentatively designed plated leads
   so that at least said predetermined pitch can be maintained between the adjacent plated leads.

4. A method according to claim 1, further comprising:
   a calculating step of,
      assuming that a central point of a substrate surface of said semiconductor package is located inside when a convex hull is calculated,
      setting clearance positions of vias and/or outermost contours of obstacles existing in the vicinity of the edge of said semiconductor package as vertexes and, based on these vertexes, calculating the convex hull; and
   a determination step of determining the wiring patterns of plated lead sections existing outside said calculated convex hull so that said plated leads are wired from the optimal positions of said determined plated leads.

* * * * *